(12) United States Patent
Sato

(10) Patent No.: US 10,740,225 B2
(45) Date of Patent: Aug. 11, 2020

(54) SEMICONDUCTOR MEMORY HAVING RADIO COMMUNICATION FUNCTION AND WRITE CONTROL METHOD

(71) Applicant: FUJITSU SEMICONDUCTOR LIMITED, Yokohama-shi, Kanagawa (JP)

(72) Inventor: Takahiko Sato, Bunkyo (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 188 days.

(21) Appl. No.: 16/038,676

(22) Filed: Jul. 18, 2018

(65) Prior Publication Data

US 2019/0034328 A1 Jan. 31, 2019

(30) Foreign Application Priority Data

Jul. 28, 2017 (JP) .................................. 2017-146567

(51) Int. Cl.
| | |
|---|---|
| *G06F 12/0888* | (2016.01) |
| *G06F 12/02* | (2006.01) |
| *G06F 11/10* | (2006.01) |
| *G06K 19/07* | (2006.01) |
| *H04L 1/08* | (2006.01) |

(Continued)

(52) U.S. Cl.
CPC .......... *G06F 12/0238* (2013.01); *G06F 11/10* (2013.01); *G06F 11/1004* (2013.01); *G06F 13/16* (2013.01); *G06K 19/0723* (2013.01); *H04L 1/08* (2013.01); *G06F 12/0888* (2013.01); *G06F 2212/1028* (2013.01); *G06F 2212/1032* (2013.01); *G06F 2212/178* (2013.01); *G06F 2212/7202* (2013.01);

(Continued)

(58) Field of Classification Search
None
See application file for complete search history.

(56) References Cited

U.S. PATENT DOCUMENTS

| | | | |
|---|---|---|---|
| 6,922,754 B2 * | 7/2005 | Liu | ...................... G06F 12/0888 |
| | | | 711/133 |
| 9,356,736 B2 | 5/2016 | Uchida | |

(Continued)

FOREIGN PATENT DOCUMENTS

| | | |
|---|---|---|
| JP | 2010-286935 A | 12/2010 |
| JP | 2015-60409 A | 3/2015 |
| JP | 2016-207011 A | 12/2016 |

*Primary Examiner* — Brian R Peugh
(74) *Attorney, Agent, or Firm* — Westerman, Hattori, Daniels & Adrian, LLP

(57) ABSTRACT

A radio communication processor receives first received data including first write data, a first address within a first area of a nonvolatile memory, and error detection information or second received data including second write data whose data amount is larger than a data amount of the first write data and a second address within a second area of the nonvolatile memory. If the radio communication processor receives the first received data, then a controller stores the first write data in a volatile buffer. If there is no error in the first write data, then the controller reads out the first write data from the volatile buffer and stores the first write data in the first area. If the radio communication processor receives the second received data, then the controller stores the second write data in the second area without storing the second write data in the volatile buffer.

14 Claims, 10 Drawing Sheets

(51) Int. Cl.
*G06F 13/16* (2006.01)
*G11C 7/10* (2006.01)

(52) U.S. Cl.
CPC ............... *G06F 2212/7203* (2013.01); *G06F 2212/7204* (2013.01); *G11C 7/1015* (2013.01); *G11C 7/1096* (2013.01)

(56) References Cited

U.S. PATENT DOCUMENTS 9,444,740 B2 * 9/2016 Yamaguchi ............. H04L 47/70
2015/0286468 A1 * 10/2015 Vaidya ................ G06F 11/3409
717/110

* cited by examiner

FIG. 5

PACKET DATWR

|  | OpeCode | MemBank | WordPtr | WordCount | DataWrite | Handle | CRC |
|---|---|---|---|---|---|---|---|
| BIT NUMBER | 8 | 2 | EBV | 8 | (WORD COUNT X 16) | 16 | 16 |
| CON-TENTS | 11000111 | BANK ADDRESS | STARTING ADDRESS | WRITE WORD COUNT | WRITE DATA | HANDLE VALUE | CRC VALUE |

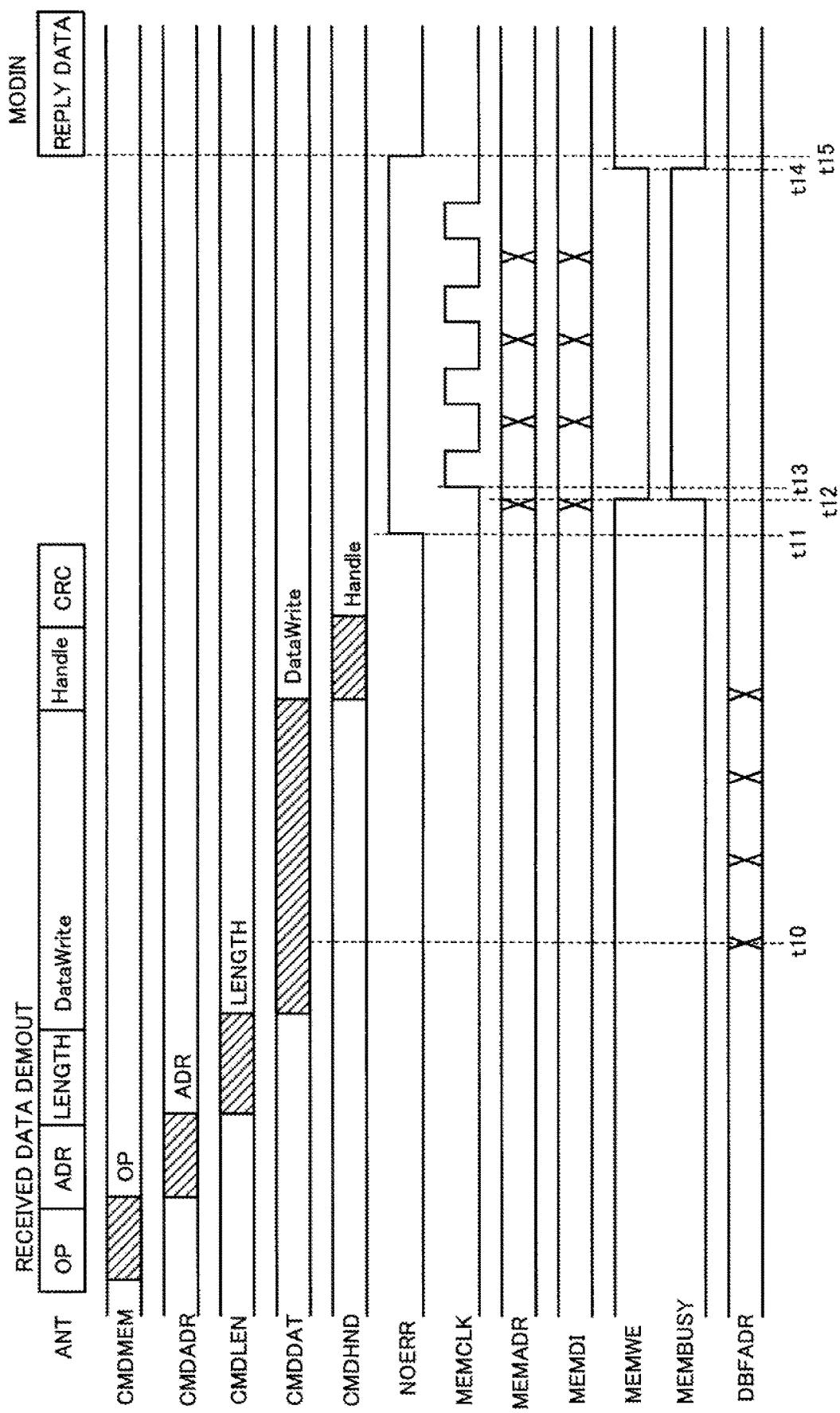

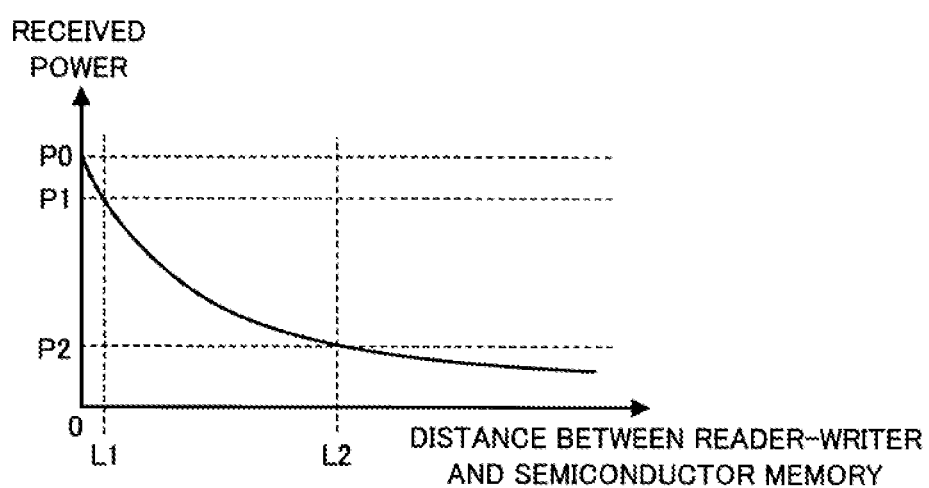

SEMICONDUCTOR MEMORY HAVING RADIO COMMUNICATION FUNCTION AND WRITE CONTROL METHOD

CROSS-REFERENCE TO RELATED APPLICATION

This application is based upon and claims the benefit of priority of the prior Japanese Patent Application No. 2017-146567, filed on Jul. 28, 2017, the entire contents of which are incorporated herein by reference.

FIELD

The embodiments discussed herein are related to a semiconductor memory having a radio communication function and a write control method.

BACKGROUND

In recent years semiconductor memories, such as radio frequency (RF) tags, having a radio communication function have increased in number. RF tags which perform radio communication in an ultra-high frequency (UHF) band are being standardized by EPCglobal (registered trademark) and are used for commodity tags and the like. Furthermore, RF tags to which an image display device, such as electronic paper, is connected are also known.

Formerly data received by an RF tag are temporarily held in a volatile storage circuit (hereinafter referred to as a volatile buffer) before the data are written to a nonvolatile memory. If en error is not detected in the data, then the data are written to the nonvolatile memory. For example, a memory write packet prescribed by the EPCglobal standard includes a cyclic redundancy check (CRC) value for error detection in addition to a command and data. A control circuit in an RF tag performs error detection on data held in a volatile buffer by the use of a CRC value. If an error is detected, then a retransmission request is made. If an error is not detected, then the data held in the volatile buffer are written to a nonvolatile memory.

Japanese Laid-open Patent Publication No. 2010-286935
Japanese Laid-open Patent Publication No. 2015-60409

However, if a semiconductor memory having a radio communication function receives not only data, such as setting information, whose data amount is comparatively small but also data, such as image data, whose data amount is comparatively large, then the storage capacity of a volatile buffer corresponds to a large data amount. As a result, data whose data amount is large are written to or read out from the volatile buffer. This increases power consumption.

SUMMARY

According to an aspect, there is provided a semiconductor memory having a radio communication function, including a nonvolatile memory having a first area and a second area; a volatile storage circuit; a radio communication processor that receives first data including first write data, a first address indicative of a write destination within the first area, and first error detection information for detecting an error in the first write data or second data including second write data whose data amount is larger than a data amount of the first write data and a second address indicative of a write destination within the second area; and a controller that determines based on the first address or the second address which of the first data and the second data the radio communication processor has received, that stores, when the radio communication processor has received the first data, the first write data in the storage circuit, detects based on the first error detection information whether or not there is an error in the first write data, and reads out from the storage circuit the first write data in which no error has been detected to store the first write data in the first area based on the first address, and that stores, when the radio communication processor has received the second data, the second write data in the second area based on the second address without storing the second write data in the storage circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 illustrates an example of a packet assembled in the case of transmitting a write command;

FIG. 9 is a timing chart illustrative of a write operation process taken as a comparative example; and FIG. 10 illustrates an example of the relationship between power received by the semiconductor memory and the distance between the reader-writer and the semiconductor memory.

DESCRIPTION OF EMBODIMENTS

Embodiments will now be described with reference to the accompanying drawings.

First Embodiment

Figure 1:
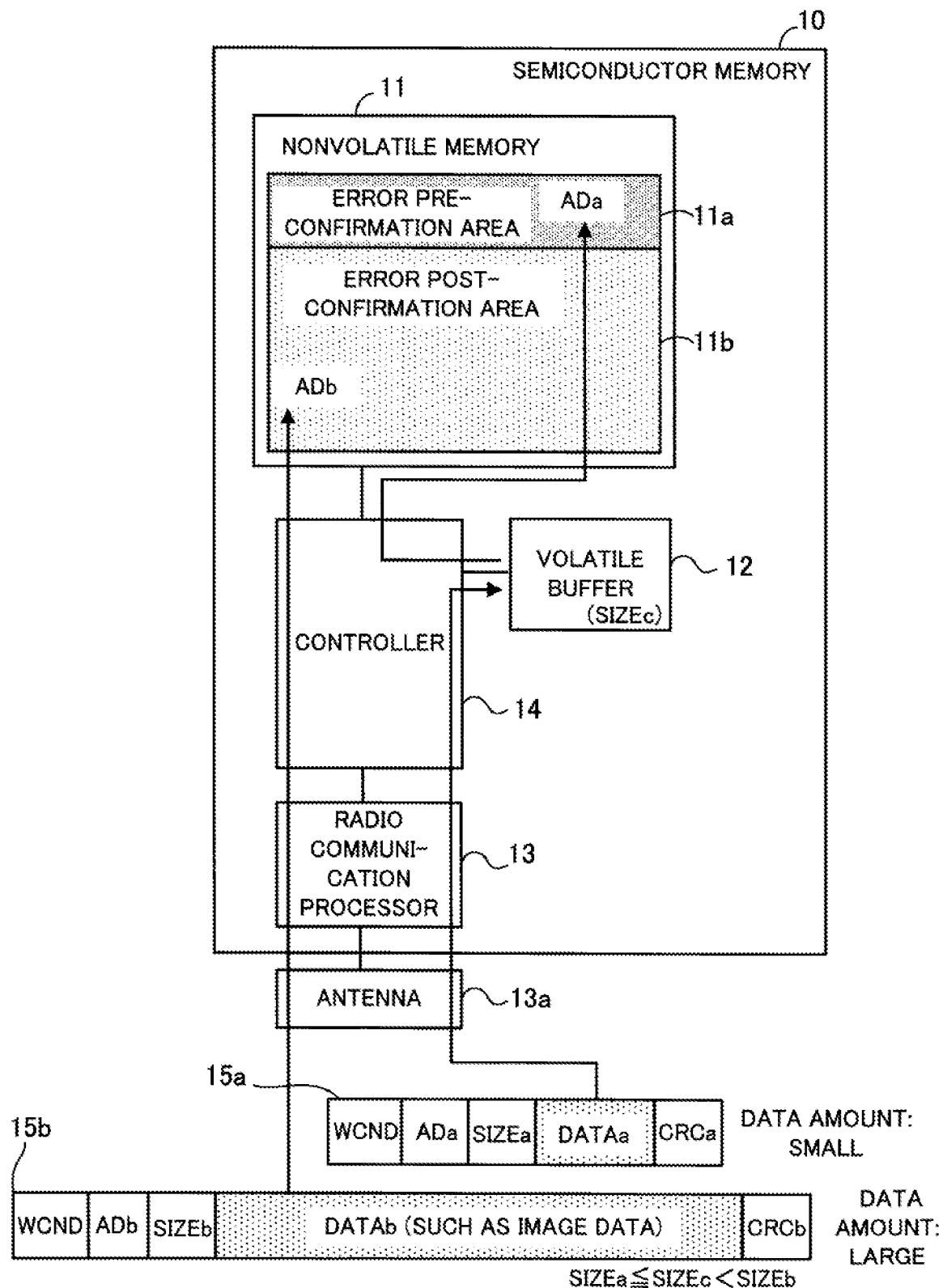
FIG. 1 illustrates an example of a semiconductor memory according to a first embodiment.

FIG. 1 illustrates an example of a semiconductor memory according to a first embodiment.

A semiconductor memory 10 is an RF tag which performs radio communication with, for example, a reader-writer (not illustrated). The semiconductor memory 10 includes a nonvolatile memory 11, a volatile buffer 12, a radio communication processor 13, and a controller 14.

The nonvolatile memory 11 includes an error pre-confirmation area 11a and an error post-confirmation area 1ib. The nonvolatile memory 11 is a flash memory, an electrically erasable programmable read-only memory (EEPROM), a ferroelectric random access memory (FeRAM), a magnetoresistive random access memory (MRAM), or the like.

The volatile buffer 12 is a volatile storage circuit which temporarily stores data for performing error detection. The volatile buffer 12 is a static random access memory (SRAM) or the like.

The radio communication processor 13 transmits data to and receives data from an external communication device (such as a reader-writer) via an antenna 13a. As illustrated in FIG. 1, for example, the radio communication processor 13 receives received data 15a or received data 15b.

The received data 15a or 15b are data (packet) which the radio communication processor 13 receives at the time of writing to the nonvolatile memory 11, and include information WCND indicative of the type of a command (indicative of a write command in FIG. 1). Furthermore, in the example of FIG. 1, the received data 15a include an address ADa indicative of a write destination within the error pre-confirmation area 11a, a size SIZEa of write data DATAa, the write data DATAa, and error detection information CRCa used for detecting an error in the write data DATAa. On the other hand, in the example of FIG. 1, the received data 15b include an address ADb indicative of a write destination within the error post-confirmation area 11b, a size SIZEb of write data DATAb, the write data DATAb, and error detection information CRCb used for detecting an error in the write data DATAb.

The radio communication processor 13 receives the received data 15a in the order of the information WCND, the address ADa, the size SIZEa, the write data DATAa, and the error detection information CRCa. Furthermore, the radio communication processor 13 receives the received data 15b in the order of the information WCND, the address ADb, the size SIZEb, the write data DATAb, and the error detection information CRCb.

The size (data amount) of the write data DATAb is larger than that of the write data DATAa. The write data DATAb are image data or the like. Compared with the write data DATAa, the write data DATAb are allowed to be stored in the nonvolatile memory 11 in a state in which the write data DATAb include an error (such as a bit inversion caused by a communication error). The importance of the write data DATAa is higher than that of the write data DATAb. The write data DATAa are setting information or the like for the semiconductor memory 10 or a device (not illustrated), such as a display device, connected to the semiconductor memory 10.

Furthermore, the size SIZEa of the write data DATAa is smaller than or equal to a storage capacity SIZEc of the volatile buffer 12. The size SIZEb of the write data DATAb may be larger than the storage capacity SIZEc.

If the semiconductor memory 10 is a passive type RF tag, then the radio communication processor 13 generates from a radio signal including the received data 15a or 15b an internal voltage for making the controller 14 or the like operate.

A process performed by the controller 14 in the case of the radio communication processor 13 receiving the received data 15a is different from a process performed by the controller 14 in the case of the radio communication processor 13 receiving the received data 15b. The controller 14 determines by, for example, the addresses ADa and ADb which of the received data 15a and 15b the radio communication processor 13 has received (which of the processes the controller 14 performs).

If the radio communication processor 13 receives the received data 15a, then the controller 14 stores the write data DATAa in the volatile buffer 12 and detects on the basis of the error detection information CRCa whether or not there is an error in the write data DATAa. If there is no error in the write data DATAa, then the controller 14 reads out the write data DATAa from the volatile buffer 12 and stores the write data DATAa in the error pre-confirmation area 11a of the nonvolatile memory 11 on the basis of the address ADa.

On the other hand, if the radio communication processor 13 receives the received data 15b, then the controller 14 stores the write data DATAb in the error post-confirmation area 11b of the nonvolatile memory 11 on the basis of the address ADb without storing the write data DATAb in the volatile buffer 12. After the controller writes the write data DATAb to the error post-confirmation area 11b of the nonvolatile memory 11, the controller 14 detects on the basis of the error detection information CRCb whether or not there is an error in the write data DATAb.

In addition, if an error is detected in the write data DATAa or the write data DATAb, then the controller 14 makes the radio communication processor 13 return to a source of the received data 15a or 15b an error response to the effect that an error is detected. Furthermore, if an error is not detected in the write data DATAa or the write data DATAb, then the controller 14 makes the radio communication processor 13 return to the source of the received data 15a or 15b a normal response to the effect that an error is not detected. For example, if the error response is returned, then the source of the received data 15a or 15b transmits the same received data 15a or 15b again.

The flow of a write control method adopted by the semiconductor memory 10 according to the first embodiment will now be described.

Figure 2:
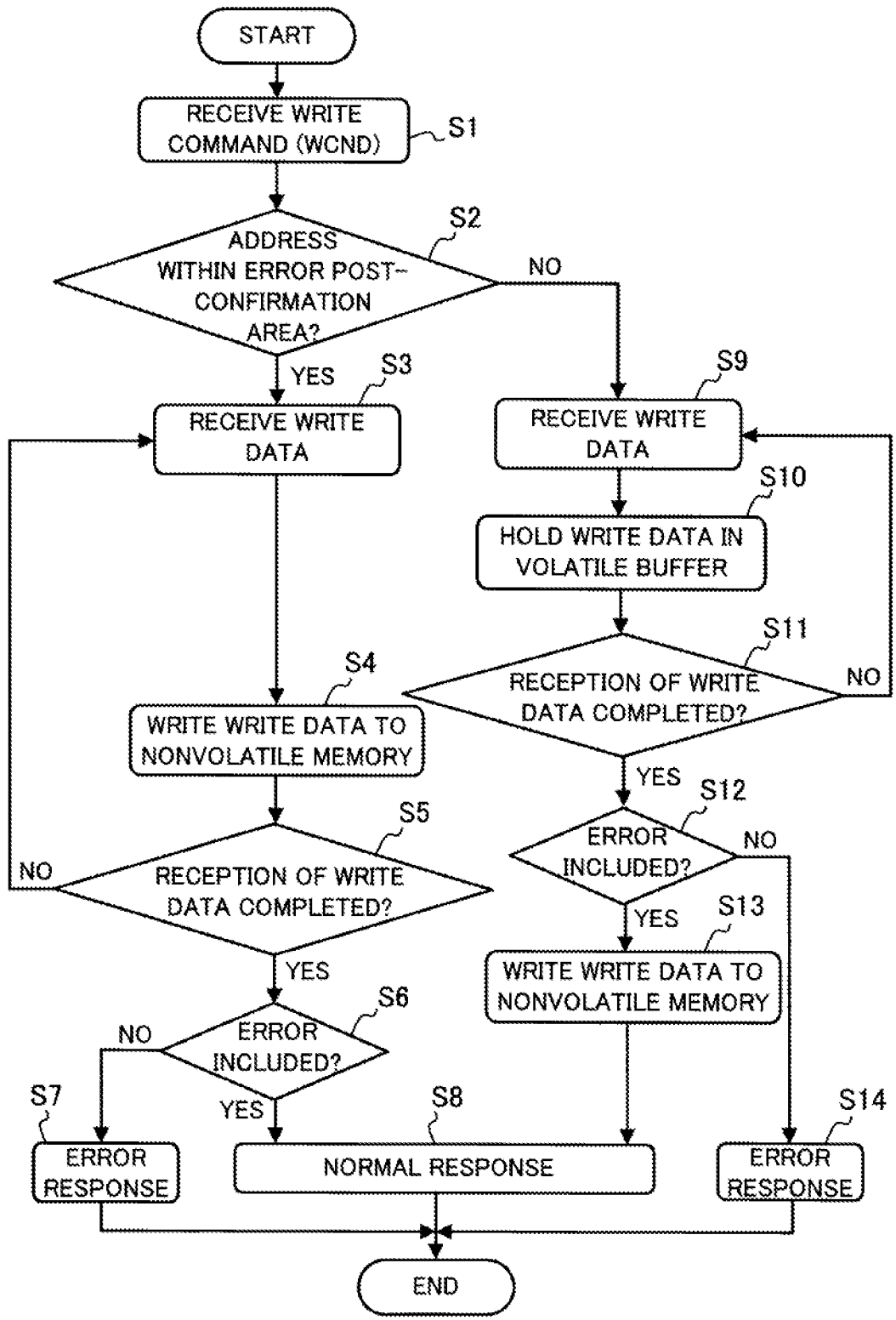
FIG. 2 is a flow chart illustrative of the flow of an example of a write control method.

FIG. 2 is a flow chart illustrative of the flow of an example of a write control method.

When the radio communication processor 13 receives information WCND indicative of a write command (step S1), the controller 14 receives an address of a write destination and determines whether or not the address is within the error post-confirmation area 11b (step S2). If the address is within the error post-confirmation area 11b, then the controller 14 writes, when the radio communication processor 13 receives write data (step S3), the write data to the error post-confirmation area 11b of the nonvolatile memory 11 (step S4). For example, if the radio communication processor 13 receives the address ADb indicated in FIG. 1, then the controller writes the write data DATAb to the error post-confirmation area 11b without storing the write data DATAb in the volatile buffer 12.

After that, if the reception of write data by the radio communication processor 13 is not completed (NO in step S5), then a process is repeated from step S3. If the reception of the write data by the radio communication processor 13 is completed (YES in step S5), then the controller 14 determines on the basis of error detection information (such as the error detection information CRCb indicated in FIG. 1) received by the radio communication processor 13 whether or not there is an error in the write data (step S6). If there is an error in the write data, then the controller 14 makes the radio communication processor 13 return an error response (step S7). If there is no error in the write data, then the controller 14 makes the radio communication processor 13 return a normal response (step S8), and ends a write process.

On the other hand, if the address is not within the error post-confirmation area 11b, then the controller 14 holds (temporarily stores), when the radio communication processor 13 receives write data (step S9), the write data in the volatile buffer 12 (step S10). For example, if the radio communication processor 13 receives the address ADa indicated in FIG. 1, then the controller 14 holds the write data DATAa in the volatile buffer 12.

After that, if the reception of write data by the radio communication processor 13 is not completed (NO in step S11), then a process is repeated from step S9. If the reception of the write data by the radio communication processor 13 is completed (YES in step S11), then the controller 14 determines on the basis of error detection information (such as the error detection information CRCa indicated in FIG. 1) received by the radio communication processor 13 whether or not there is an error in the write data (step S12). If there is no error in the write data, then the controller 14 reads out the write data held in the volatile buffer 12, and writes the write data to the error pre-confirmation area 11a of the nonvolatile memory (step S13). After that, the controller 14 makes the radio communication processor 13 return a normal response (step S8). If there is an error in the write data, then the controller 14 makes the radio communication processor 13 return an error response (step S14), and ends a write process.

The above semiconductor memory 10 stores the write data DATAb whose data amount is larger than that of the write data DATAa in the error post-confirmation area 11b of the nonvolatile memory 11 without storing the write data DATAb in the volatile buffer 12. As a result, the write data DATAb, such as image data, whose data amount is comparatively large are not written to or read out from the volatile buffer 12. This reduces power consumption.

The semiconductor memory 10 may be a passive type RF tag. In this case, the semiconductor memory 10 operates by less power because of a reduction in power consumption. As a result, the communication distance between a reader-writer from which power is supplied and the semiconductor memory 10 is increased.

In addition, the semiconductor memory 10 may be an active type RF tag with a built-in battery. In this case, the frequency of battery replacement decreases because of a reduction in power consumption. As a result, the convenience of maintenance or a reduction in the maintenance costs is expected.

Moreover, there is no need for the volatile buffer 12 of the semiconductor memory 10 according to the first embodiment to hold the write data DATAb whose data amount is large. As a result, the size of the volatile buffer 12 is suppressed and the cost of the volatile buffer 12 is reduced. Therefore, the semiconductor memory 10 according to the first embodiment is suitable for an Internet-of-Things (IoT) technique in which miniaturization of or a reduction in the costs of a radio terminal (such as an RF tag) is needed.

Furthermore, after the controller 14 checks that there is no error in the write data DATAa, the write data DATAa are stored in the error pre-confirmation area 11a of the nonvolatile memory 11. Accordingly, data (such as setting information) whose importance is higher than that of image data or the like are considered as the write data DATAa. This prevents data in an erroneous state whose importance is high from being written to the nonvolatile memory 11. It is assumed that after the write data DATAa are written directly to the nonvolatile memory 11, error detection is performed. If an error is detected, then the erroneous write data DATAa may be used before the error is corrected by retransmission. On the other hand, the semiconductor memory 10 according to the first embodiment prevents the write data DATAa in an erroneous state from being written to the nonvolatile memory 11. This prevents data before error correction whose importance is high from being used.

In addition, if the write data DATAb are divided into small-sized data and are transmitted or received many times, then overhead occurs because of the information WCND, the address ADb, and the like and a data transfer amount increases. With the above semiconductor memory 10, however, this overhead is suppressed. The reason for this is that the size SIZEb of the write data DATAb included in the received data 15b may be made larger than the storage capacity SIZEc of the volatile buffer 12. As a result, a data transfer amount decreases and time taken to write to a memory is reduced. Accordingly, power consumption is reduced further.

If the address ADb changes because of a communication error to a value within the error pre-confirmation area 11a, then the write data DATAb overflow the volatile buffer 12. Therefore, an error is detected at the time of error detection performed by the use of the error detection information CRCb. This prevents the write data DATAb form being erroneously written to the error pre-confirmation area 11a. The error pre-confirmation area 11a where data whose importance is high are written is protected in this way.

Conversely, if the address Ada changes because of a communication error to a value within the error post-confirmation area 11b, then the write data DATAa are written to the error post-confirmation area 11b. However, after the write data DATAa are written to the error post-confirmation area 11b, an error is detected in step S6. As a result, an error response is issued and the same received data 15a are received again. If there is no error, then the write data DATAa are written to the error pre-confirmation area 11a.

By the way, a partial area of the nonvolatile memory 11 may be used in place of the volatile buffer 12. In that case, however, the following process is performed. After error detection, data are read out from the partial area of the nonvolatile memory 11 and are written to another area of the nonvolatile memory 11. This increases current consumption. Furthermore, if the partial area of the nonvolatile memory 11 used in place of the volatile buffer 12 becomes large, an area in which data are saved ultimately becomes small.

In addition, the nonvolatile memory 11 may be divided not into the error pre-confirmation area 11a and the error post-confirmation area 11b but into one data save area and an index area. In this case, a table or the like which manages an address of the data save area to which data are written after being stored in the volatile buffer 12 and an address of the data save area to which data are written without being stored in the volatile buffer 12 is built in the index area. This may make the data save area small.

With the semiconductor memory 10 according to the first embodiment these problems do not arise.

In the example of FIG. 1, there are one error pre-confirmation area 11a and one error post-confirmation area 11b. However, there may be a plurality of error pre-confirmation areas 11a and a plurality of error post-confirmation areas 11b.

Second Embodiment

Figure 3:
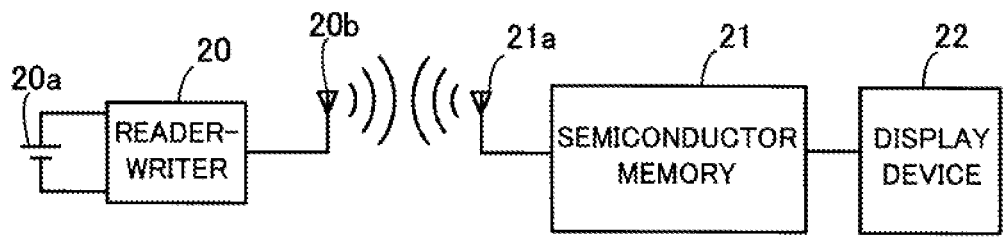
FIG. 3 illustrates an example of a radio communication system according to a second embodiment.

FIG. 3 illustrates an example of a radio communication system according to a second embodiment.

A radio communication system includes a reader-writer 20, a semiconductor memory 21, and a display device 22.

Power is supplied to the reader-writer 20 by a battery 20a. The reader-writer 20 transmits various commands, data, and the like to the semiconductor memory 21 and receives responses from the semiconductor memory 21, via an antenna 20b.

The semiconductor memory 21 receives radio signals including the various commands, the data, and the like and returns the responses to the reader-writer 20, via an antenna 21a. Furthermore, the semiconductor memory transmits image data, various pieces of setting information, and the like to the display device 22 and receives responses from the display device 22.

The display device 22 is electronic paper or the like and displays the image data transmitted from the semiconductor memory 21.

In the example of FIG. 3, the semiconductor memory 21 or the display device 22 is not equipped with a battery. The semiconductor memory 21 generates an internal voltage from a radio signal received via the antenna 21a and uses the internal voltage for its communication, writing to or reading from a nonvolatile memory, controlling the display device 22, supplying power to the display device 22, or the like.

(Example of Reader-Writer 20)

Figure 4:
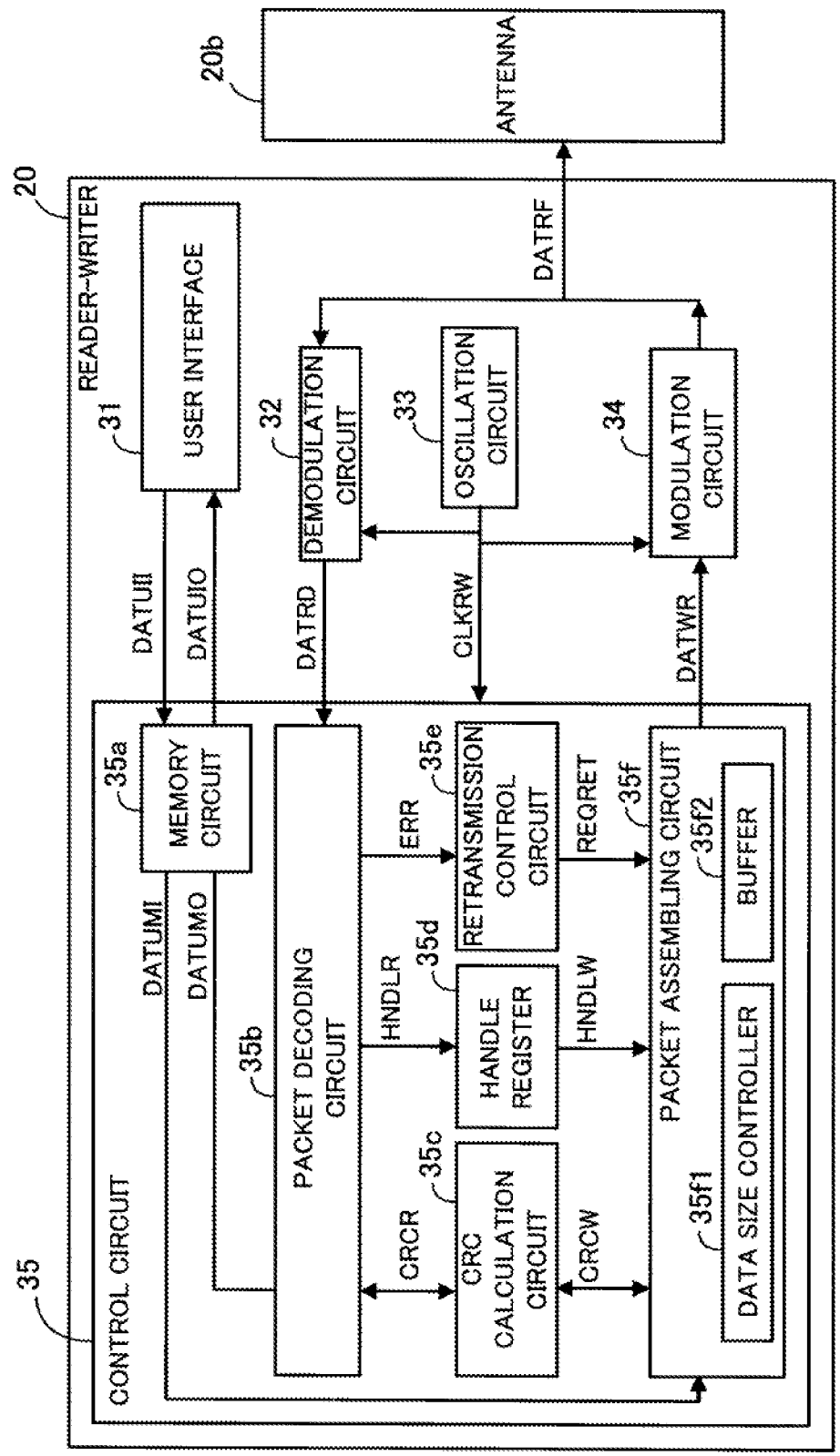
FIG. 4 illustrates an example of a reader-writer.

FIG. 4 illustrates an example of the reader-writer.

The reader-writer 20 includes a user interface 31, a demodulation circuit 32, an oscillation circuit 33, a modulation circuit 34, and a control circuit 35.

The user interface 31 is a touch panel or the like and accepts the type of a command, data, address information for accessing the nonvolatile memory of the semiconductor memory 21, and the like inputted by a user. Furthermore, the user interface 31 supplies the type of a command, the data, the address information, and the like to the control circuit 35 as information DATUII. The user interface 31 may inform the user of a packet decoding result DATUIO, for example, by receiving the packet decoding result DATUIO from the control circuit 35 and displaying it.

The demodulation circuit 32 demodulates a signal received via the antenna 20b and transmits it as information DATRD to the control circuit 35.

The oscillation circuit 33 generates a clock signal CLKRW for making the demodulation circuit 32, the modulation circuit 34, and the control circuit 35 operate.

The modulation circuit 34 modulates a packet DATWR generated by the control circuit 35 and transmits it as a signal DATRF to the antenna 20b.

The control circuit 35 includes a memory circuit 35a, a packet decoding circuit 35b, a CRC calculation circuit 35c, a handle register 35d, a retransmission control circuit 35e, and a packet assembling circuit 35f.

The memory circuit 35a temporarily stores the information DATUII or a packet decoding result DATUMO outputted by the packet decoding circuit 35b. At least part of the information DATUII is read out as information DATUMI from the memory circuit 35a and is supplied to the packet assembling circuit 35f. Furthermore, at least part of the packet decoding result DATUMO may be read out as the packet decoding result DATUIO from the memory circuit 35a and be supplied to the user interface 31.

The packet decoding circuit 35b extracts from the information DATRD information used for calculating a CRC value, transmits the information to the CRC calculation circuit 35c, and receives a CRC value CRCR from the CRC calculation circuit 35c. Furthermore, if the CRC value CRCR is different from a CRC value included in the information DATRD, then the packet decoding circuit 35b informs the retransmission control circuit 35e of an error signal ERR indicative of the occurrence of an error. In addition, if the reader-writer 20 transmits a command to acquire the handle value of the semiconductor memory 21, a handle value HNDLR is included in the information DATRD obtained from a response of the semiconductor memory 21 to the command. If the above error has not occurred, the packet decoding circuit 35b records in the handle register 35d the handle value HNDLR included in the information DATRD. The handle value HNDLR is information for identifying the semiconductor memory 21.

On the basis of information transmitted from the packet decoding circuit 35b or the packet assembling circuit 35f, the CRC calculation circuit 35c calculates the CRC value CRCR or a CRC value CRCW. Furthermore, the CRC calculation circuit 35c transmits the CRC value CRCR to the packet decoding circuit 35b and transmits the CRC value CRCW to the packet assembling circuit 35f.

The handle register 35d holds the handle value HNDLR. The handle register 35d may hold the handle values of a plurality of semiconductor memories (RF tags). Furthermore, handle values HNDLW (if as illustrated in FIG. 3, the number of a command transmission destination is one, then the handle value HNDLW is equal to the handle value HNDLR) of semiconductor memories, which are command transmission destinations, are read out from the handle register 35d to the packet assembling circuit 35f.

When the retransmission control circuit 35e receives the error signal ERR, the retransmission control circuit 35e informs the packet assembling circuit 35f of a retransmission request REQRET.

The packet assembling circuit 35f extracts from the information DATUMI information used for calculating a CRC value, transmits the information to the CRC calculation circuit 35c, and receives the CRC value CRCW from the CRC calculation circuit 35c. In addition, when the packet assembling circuit 35f detects from the information DATUMI that a request to write to the nonvolatile memory of the semiconductor memory 21 is made, the packet assembling circuit 35f designates a write destination address in the following way on the basis of the address information included in the information DATUMI.

On the basis of the information DATUMI, for example, the packet assembling circuit 35f classifies write data into two categories: data, such as setting information for the display device 22 (information for setting a voltage, an image size, and the like), and data, such as image data displayed by the display device 22, whose importance is lower than that of the above data (whose error tolerance is higher than that of the above data) and whose data amount is comparatively large. By doing so, the packet assembling circuit 35f manages the write data.

Furthermore, on the basis of the address information, the packet assembling circuit 35f designates as a write destination an address within an error pre-confirmation area of the nonvolatile memory for the data such as the setting information. In addition, the packet assembling circuit 35f designates as a write destination an address within an error post-confirmation area of the nonvolatile memory for the data such as the image data.

The packet assembling circuit 35f assembles a packet DATWR including the handle value HNDLW, the CRC value CRCW, an address, write data, the size of the write data, and the like and outputs the packet DATWR.

As described later, write data written to the error pre-confirmation area are temporarily stored in a write data buffer (corresponding to the volatile buffer 12 in the first embodiment) of the semiconductor memory 21. Accordingly, if the size of write data written to the error pre-confirmation area exceeds the storage capacity of the write data buffer, then a data size controller 35f1 of the packet assembling circuit 35f divides the write data and assembles a packet DATWR. On the other hand, as described later, write data written to the error post-confirmation area are written to the nonvolatile memory without being stored in the write data buffer. As a result, the data size controller 35f1 of the packet assembling circuit 35f permits the size of write data written to the error post-confirmation area which exceeds the storage capacity of the write data buffer, and assembles a packet DATWR.

The packet assembling circuit 35f includes a buffer 35f2 which temporarily holds the assembled packet DATWR. If the packet assembling circuit 35f receives a retransmission request REQRET, then the packet assembling circuit 35f outputs the held packet DATWR again.

FIG. 5 illustrates an example of a packet assembled in the case of transmitting a write command.

FIG. 5 illustrates an example of a packet DATWR of a memory write command (BlockWrite) standardized by EPCglobal.

First the packet DATWR includes 8-bit "OpeCode" (11000111) indicative of a write command. Furthermore, the packet DATWR includes 2-bit "MemBank" indicative of the address of a bank of the nonvolatile memory of the semiconductor memory 21, which is a write destination, and "WordPtr" indicative of a write starting address. "WordPtr" is designated by extensible bit vectors (EBVs). In addition, the packet DATWR includes 8-bit "WordCount" indicative of a write word count, (word count×16)-bit "DataWrite" indicative of write data, 16-bit "Handle" indicative of a handle value, and 16-bit "CRC" indicative of a CRC value.

If "WordPtr" is represented by 16 bits in the packet DATWR illustrated in FIG. 5, then a data amount except the write data is 66 bits. If data, such as image data, whose size is large are divided into small-sized data to assemble packets DATWR and transfer the packets DATWR to the semiconductor memory 21, then overhead corresponding to 66 bits occurs every packet DATWR and a virtual data transfer amount increases. This lengthens communication time and increases power consumption.

As described later, the semiconductor memory 21 according to the second embodiment stores data, such as image data, whose size is large in the nonvolatile memory without storing the data in the write data buffer. Accordingly, as stated above, the reader-writer 20 puts into one packet DATWR write data whose data amount exceeds the storage capacity of the write data buffer. This reduces a data transfer amount, communication time, and time taken to write to a memory. As a result, power consumption is reduced.

(Example of Semiconductor Memory 21)

Figure 6:
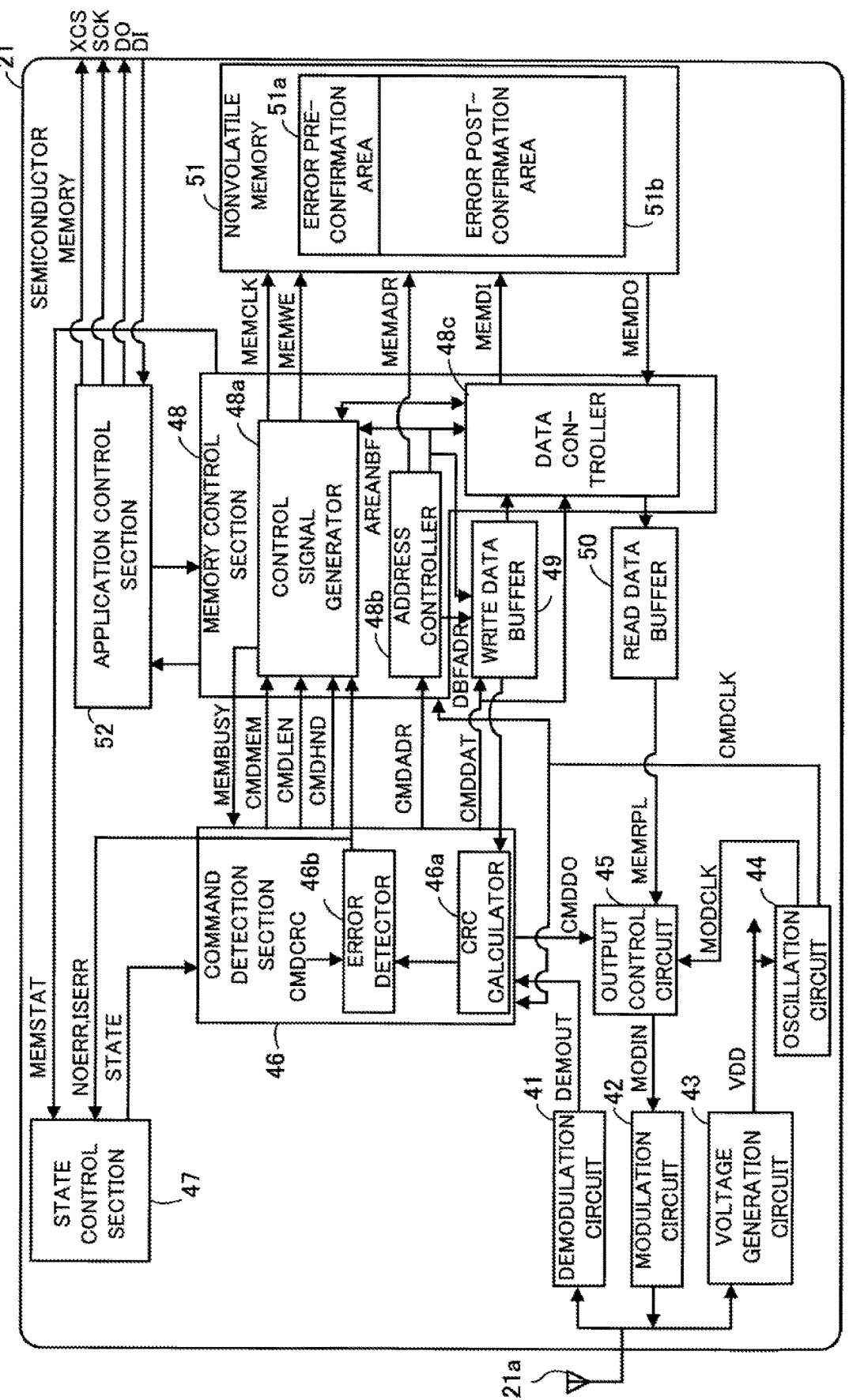
FIG. 6 illustrates an example of a semiconductor memory according to the second embodiment.

FIG. 6 illustrates an example of the semiconductor memory according to the second embodiment.

The semiconductor memory 21 includes a demodulation circuit 41, a modulation circuit 42, a voltage generation circuit 43, an oscillation circuit 44, an output control circuit 45, a command detection section 46, a state control section 47, and a memory control section 48. Furthermore, the semiconductor memory 21 includes a write data buffer 49, a read data buffer 50, a nonvolatile memory 51, and an application control section 52.

The demodulation circuit 41, the modulation circuit 42, the voltage generation circuit 43, the oscillation circuit 44, and the output control circuit 45 form an example of a circuit element group for realizing the function of the radio communication processor 13 included in the semiconductor memory 10 according to the first embodiment. The command detection section 46, the state control section 47, and the memory control section form an example of a circuit element group for realizing the function of the controller 14 included in the semiconductor memory 10 according to the first embodiment.

The demodulation circuit 41 demodulates a radio signal received via the antenna 21a and outputs received data DEMOUT.

The modulation circuit 42 modulates reply data MODIN and supplies them to the antenna 21a.

The voltage generation circuit 43 generates an internal voltage VDD by rectifying the received radio signal.

On the basis of the internal voltage VDD, the oscillation circuit 44 generates a clock signal CMDCLK or a clock signal MODCLK. The clock signal CMDCLK is supplied to the command detection section 46 or the memory control section 48 and the clock signal MODCLK is supplied to the output control circuit 45.

The output control circuit 45 generates and outputs the reply data MODIN including response data CMDDO (such as a CRC value and a handle value) transmitted from the command detection section 46 and read data MEMRPL read out from the read data buffer 50, for example.

The internal voltage VDD is supplied not only to the oscillation circuit 44 but also to each section (not illustrated) of the semiconductor memory 21 which operates on the basis of the internal voltage VDD.

The command detection section 46 receives a state signal STATE, a signal MEMBUSY, or the received data DEMOUT and exercises command control on the basis of the state signal STATE, the signal MEMBUSY, or the received data DEMOUT. For example, the command detection section 46 receives as the received data DEMOUT the same packet as the packet DATWR illustrated in FIG. 5. The command detection section 46 detects information included in the packet, such as the packet DATWR illustrated in FIG. 5, in the order of "OpeCode," "MemBank," "WordPtr," "WordCount," "DataWrite," "Handle," and "CRC". Furthermore, the command detection section 46 outputs information CMDMEM indicative of the value of "OpeCode". In addition, the command detection section 46 outputs information CMDADR indicative of the values of "MemBank" and "WordPtr," information CMDLEN indicative of the value of "WordCount," and information CMDHND indicative of the value of "Handle". Moreover, the command detection section 46 outputs information CMDDAT indicative of the contents of "DataWrite".

If the signal MEMBUSY which indicates that the nonvolatile memory 51 is in a busy state is asserted, then the command detection section 46 stops outputting the above information regarding commands.

Furthermore, in the example of FIG. 6, the command detection section 46 includes a CRC calculator 46a and an error detector 46b. The CRC calculator 46a calculates a CRC value by the use of the received data DEMOUT except "CRC". The error detector 46b compares information CMD-CRC, which is a CRC value included in the received data DEMOUT, and the CRC value calculated by the CRC calculator 46a to detect whether or not there is an error. If there is an error, then the error detector 46b asserts a signal ISERR. If there is no error, then the error detector 46b asserts a signal NOERR.

The CRC calculator 46a generates a CRC value by the use of response data including read data read out from the nonvolatile memory 51 and stored in the read data buffer 50, and the command detection section 46 outputs response data CMDDO including the CRC value (details are not illustrated).

On the basis of a signal MEMSTAT, the signal NOERR, or the signal ISERR, the state control section 47 outputs the state signal STATE. For example, if the signal ISERR is asserted, then the state control section 47 outputs to the command detection section 46 the state signal STATE by which the state control section 47 makes the command detection section 46 generate the response data CMDDO indicative of an error response. If the signal NOERR is asserted, then the state control section 47 outputs to the command detection section 46 the state signal STATE by which the state control section 47 makes the command detection section 46 generate the response data CMDDO indicative of a normal response. In addition, if the state control section 47 is informed by the signal MEMSTAT that reading out data from the nonvolatile memory 51 ends, then the state control section 47 outputs to the command detection section 46 the state signal STATE by which the state control section 47 makes the command detection section 46 add a handle value and a CRC value as response data after the read data.

The memory control section 48 includes a control signal generator 48a, an address controller 48b, and a data controller 48c.

The control signal generator 48a receives the information CMDMEM, CMDLEN, or CMDHND, the signal NOERR, the signal ISERR, or a signal AREANBF. On the basis of the information CMDMEM, CMDLEN, or CMDHND, or the signal NOERR, ISERR, or AREANBF, the control signal generator 48a generates a control signal such as a write enable signal MEMWE or a clock signal MEMCLK.

The signal AREANBF is outputted by the address controller 48b and indicates whether a write destination address is within an error pre-confirmation area 51a or an error post-confirmation area 51b of the nonvolatile memory 51.

If the information CMDMEM indicates a write command and the information CMDHND indicates the handle value of the semiconductor memory 21, then the control signal generator 48a performs the following operation.

When the control signal generator 48a receives the signal AREANBF which indicates that a write destination address is within the error post-confirmation area 51b, the control signal generator 48a asserts the write enable signal MEMWE and outputs the clock signal MEMCLK, for a period based on the information CMDLEN. On the other hand, when the control signal generator 48a receives the signal AREANBF which indicates that a write destination address is within the error pre-confirmation area 51a, the control signal generator 48a asserts the write enable signal MEMWE and outputs the clock signal MEMCLK, after assertion of the signal NOERR.

For example, while the write enable signal MEMWE is being asserted, the control signal generator 48a asserts the signal MEMBUSY which indicates that the nonvolatile memory 51 is in a busy state.

The address controller 48b receives the information CMDADR, generates a memory address MEMADR on the basis of the information CMDADR, and supplies the memory address MEMADR to the nonvolatile memory 51. In addition, the address controller 48b outputs the signal AREANBF which indicates whether an address indicated by the information CMDADR is within the error pre-confirmation area 51a or the error post-confirmation area 51b. Hereinafter (logical level of) the signal AREANBF is as follows. It is assumed that if an address indicated by the information CMDADR is within the error pre-confirmation area 51a, the signal AREANBF is at a low (L) level and that if an address indicated by the information CMDADR is within the error post-confirmation area 51b, the signal AREANBF is at a high (H) level.

In addition, the address controller 48b has the function of designating an address DBFADR of the write data buffer 49.

If the signal AREANBF is at the L level at the time of writing to the nonvolatile memory 51, then the data controller 48c selects data supplied from the write data buffer 49 and outputs the data as write data MEMDI. If the signal AREANBF is at the H level at the time of writing to the nonvolatile memory 51, then the data controller 48c selects the information CMDDAT and outputs the information CMDDAT as write data MEMDI.

Furthermore, the data controller 48c has the function of detecting that the information CMDDAT reaches the bit number by which the information CMDDAT is written to the nonvolatile memory 51 and informing the control signal generator 48a of it. In addition, the data controller 48c supplies read data MEMDO to the read data buffer 50 under the control of the control signal generator 48a at the time of reading out from the nonvolatile memory 51.

Moreover, the memory control section 48 transmits to or receives from the application control section 52 various pieces of information or image data. This will be described later.

The write data buffer 49 is a volatile storage circuit which temporarily stores the information CMDDAT. However, if the signal AREANBF is at the H level, then the write data buffer 49 is nullified and does not store the information CMDDAT.

The read data buffer 50 is a volatile storage circuit which temporarily stores the read data MEMDO read out by the data controller 48c.

The nonvolatile memory 51 is a flash memory, an EEPROM, an FeRAM, an MRAM, or the like. The nonvolatile memory 51 has the error pre-confirmation area 51a and the error post-confirmation area 51b distinguished by an address.

The write data MEMDI stored in the write data buffer 49 are stored in the error pre-confirmation area 51a. The information CMDDAT is stored as the write data MEMDI in the error post-confirmation area 51b without being stored in the write data buffer 49. Data, such as image data, whose size is comparatively large are stored in the error post-confirmation area 51b. Therefore, in the example of FIG. 6, the error post-confirmation area 51b is wider than the error pre-confirmation area 51a.

On the basis of the various pieces of information or the image data received from the memory control section 48, the application control section 52 outputs a chip select signal, a clock signal, or data. The chip select signal, the clock signal, or the data are supplied to the display device 22 via a terminal XCS, SCK, or DO. Furthermore, the application control section 52 receives via a terminal DI data outputted by the display device 22.

Figure 7:
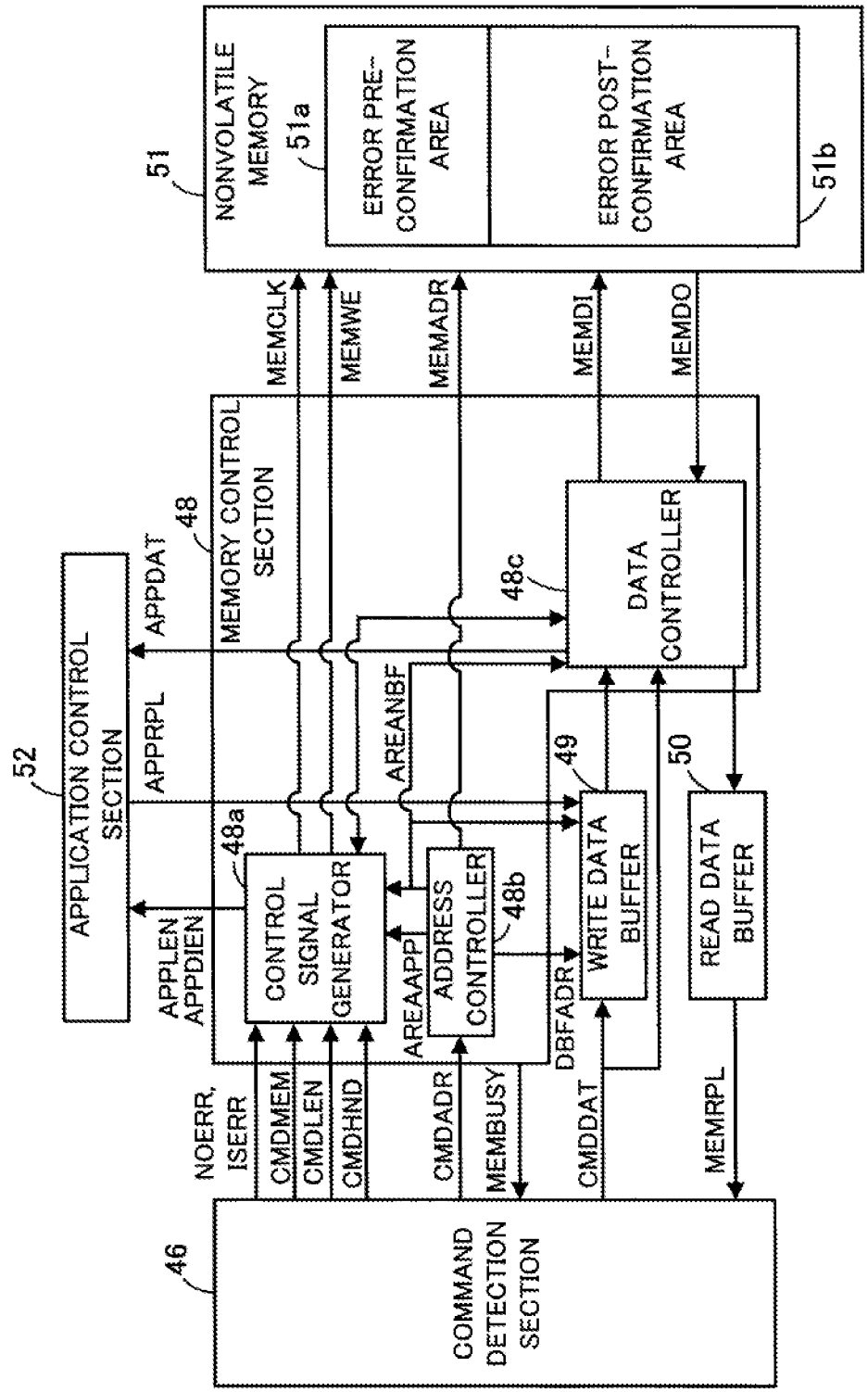
FIG. 7 is a view for describing data transmission and reception between a memory control section and an application control section.

FIG. 7 is a view for describing data transmission and reception between the memory control section and the application control section.

When the address controller 48b determines from the information CMDADR that a command to a specific address is received, the address controller 48b asserts a signal AREAAPP to perform an application operation.

It is assumed that a command identified from the information CMDMEM is a command to supply data (such as image data or setting information) to the display device 22. When the signal AREAAPP is asserted, the control signal generator 48a outputs information APPLEN indicative of the length of the data. Furthermore, it is assumed that a command identified from the information CMDMEM is a command to read out data, such as a parameter, from the display device 22. The control signal generator 48a asserts a signal APPDIEN which makes reading out from the display device 22 effective.

As illustrated in FIG. 7, for example, read data APPRPL read out from the display device 22 are supplied to the write data buffer 49 via the application control section 52 and then written to the nonvolatile memory 51. The read data APPRPL may be supplied to the read data buffer 50 via the application control section 52 and then transmitted to the reader-writer 20.

The information APPLEN is included in the information CMDDAT. For example, the information APPLEN is written to the nonvolatile memory 51. After that the information APPLEN is read out and used when the signal AREAAPP is asserted. In FIG. 7, a path along which the information APPLEN is read out is not illustrated. The information APPLEN may be extracted from the information CMDDAT before it is written to the nonvolatile memory 51.

If a command identified from the information CMDMEM is a command to make the display device 22 display an image, then the data controller 48c supplies to the application control section 52 application data APPDAT including image data of the read data MEMDO.

Under the control of the control signal generator 48a, the data controller 48c does not write the information CMDDAT to the nonvolatile memory 51 but may supply the information CMDDAT to the application control section 52 as the application data APPDAT.

(Example of Write Operation Process)

Figure 8:
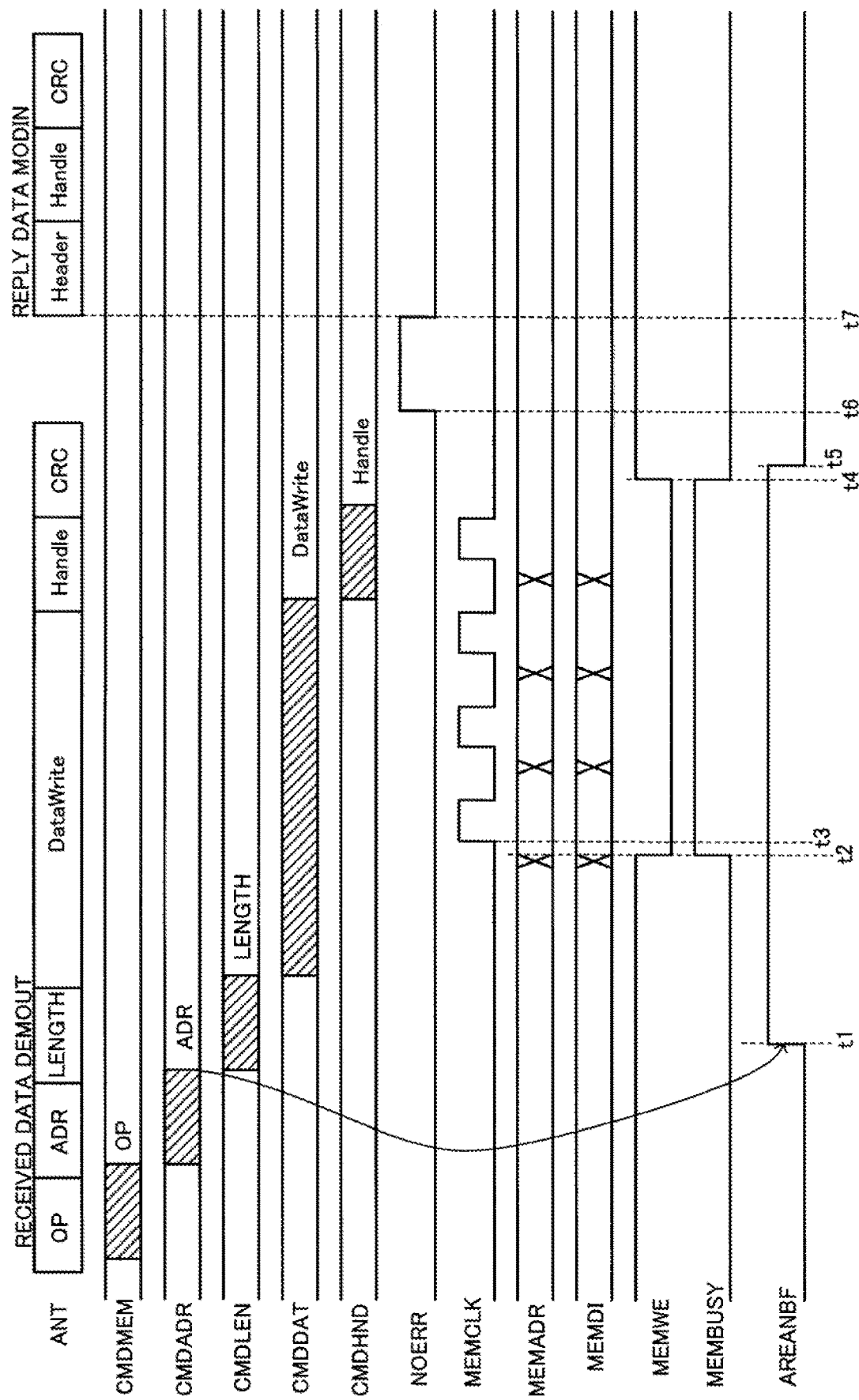
FIG. 8 is a timing chart illustrative of an example of a write operation process.

FIG. 8 is a timing chart illustrative of an example of a write operation process. FIG. 8 illustrates an example of operation performed at the time of writing write data to the nonvolatile memory 51 without storing the write data in the write data buffer 49.

In FIG. 8, "ANT" indicates received data DEMOUT and reply data MODIN. For example, the received data DEMOUT is the same as the packet DATWR illustrated in FIG. 5. In FIG. 8, however, "OpeCode" included in the packet DATWR illustrated in FIG. 5 is indicated by "OP". "MemBank" and "WordPtr" are indicated by "ADR" in the block. Furthermore, "WordCount" in FIG. 5 is indicated by "LENGTH" in FIG. 8.

The command detection section 46 detects "OP," "ADR," "LENGTH," "DataWrite," "Handle," and "CRC" in that order. As a result, as illustrated in FIG. 8, the values of information CMDMEM, CMDADR, CMDLEN, CMDDAT, and CMDHND indicate the detected contents in order.

In the example of FIG. 8, a signal AREANBF becomes an H level (timing t1) after the command detection section 46 detects "ADR". The reason for this is that an address indicated by "ADR" is within the error post-confirmation area 51b. As a result, the write data buffer 49 is nullified and does not store "DataWrite". At the time when "DataWrite" received as serial data reaches the bit number by which "DataWrite" are written to the nonvolatile memory 51, the memory control section 48 asserts a write enable signal MEMWE by making it an L level (timing t2). Furthermore, at this time the memory control section 48 asserts a signal MEMBUSY by making it an H level.

In addition, the memory control section 48 outputs a clock signal MEMCLK (timing t3). As a result, write data MEMDI indicated by "DataWrite" are written to a position (within the error post-confirmation area 51b) designated by a memory address MEMADR generated on the basis of "ADR". In the example of FIG. 8, "LENGTH"=4. At the same time that count-up of the memory address MEMADR is being controlled, the write data MEMDI corresponding to 4 addresses are written with the address indicated by "ADR" as a write starting address.

When writing to the nonvolatile memory 51 ends, the memory control section 48 makes the write enable signal MEMWE an H level and makes the signal MEMBUSY an L level (timing t4). Furthermore, the memory control section 48 makes the signal AREANBF an L level (timing t5).

In addition, if the command detection section 46 detects by an error detection process based on detected "CRC" that there is no error, then a signal NOERR is at an H level for a certain period (timing t6). Furthermore, reply data MODIN generated by the output control circuit 45 are modulated by the modulation circuit 42 and are transmitted via the antenna 21a (timing t7). The reply data MODIN includes "Header," "Handle," and "CRC".

As stated above, if the address indicated by "ADR" is within the error post-confirmation area 51b, then "DataWrite" are written to the nonvolatile memory 51 without being stored in the write data buffer 49.

If the command detection section 46 detects by an error detection process based on detected "CRC" that there is an error, then a signal ISERR is at an H level for a certain period in place of the signal NOERR. In this case, erroneous data are written to an area having a length designated by "LENGTH" from the address indicated by "ADR". However, the same data are retransmitted because of an error response. Accordingly, the data in that area are corrected. If image data are written to the error post-confirmation area 51b, then the semiconductor memory 21 may make the display device 22 display the image data to inform a user of the presence or absence of an error. Furthermore, if there is an error, then the semiconductor memory 21 may make an error response on the basis of the user's input.

In addition, if a communication error occurs in the address indicated by "ADR" and the address changes to a value within the error pre-confirmation area 51a, then "DataWrite" are stored in the write data buffer 49. However, because the data amount of "DataWrite" to be written to the error post-confirmation area 51b is larger than the storage capacity of the write data buffer 49, "DataWrite" overflow the write data buffer 49. Accordingly, an error is detected by an error detection process based on "CRC" and "DataWrite" are not written to the error pre-confirmation area 51a.

An example of operation performed in a case where "DataWrite" having "LENGTH" that is the same as the above "LENGTH" are temporarily stored in the write data buffer 49 and are then written to the nonvolatile memory 51 will now be described as a comparative example.

FIG. 9 is a timing chart illustrative of a write operation process taken as a comparative example.

In FIG. 9, the values of information CMDMEM, CMDADR, CMDLEN, CMDDAT, and CMDHND indicate the detected contents in order. This is the same with the process illustrated in FIG. 8.

In the example of FIG. 9, however, writing "DataWrite" received as serial data to the write data buffer 49 begins at timing t10. At the same time that count-up of an address DBFADR of the write data buffer 49 is being controlled, "DataWrite" corresponding to 4 addresses are written to the write data buffer 49.

If the command detection section 46 detects by an error detection process based on detected "CRC" that there is no error, then a signal NOERR becomes an H level (timing t11). While the signal NOERR is at the H level, the memory control section 48 makes a write enable signal MEMWE an L level and makes a signal MEMBUSY an H level (timing t12).

In addition, the memory control section 48 outputs a clock signal MEMCLK (timing t13). As a result, write data MEMDI indicated by "DataWrite" are written to an area of the nonvolatile memory 51 designated by a memory address MEMADR generated on the basis of "ADR".

When writing to the nonvolatile memory 51 ends, the memory control section 48 makes the write enable signal MEMWE an H level and makes the signal MEMBUSY an L level (timing t14). Furthermore, when the command detection section 46 makes the signal NOERR an L level (timing t15), reply data MODIN generated by the output control circuit 45 are modulated by the modulation circuit 42 and are transmitted via the antenna 21a.

With the write operation in the above comparative example, "DataWrite" are temporarily stored in the write data buffer 49. After it is checked that there is no error in "DataWrite," "DataWrite" are written to the nonvolatile memory 51. Therefore, if "DataWrite" are data, such as image data, whose data amount is comparatively large, then the size of the write data buffer 49 becomes large. As a result, "DataWrite" whose data amount is large are written to or read out from the write data buffer 49. This increases power consumption.

As illustrated in FIG. 8, on the other hand, if the address indicated by "ADR" is within the error post-confirmation area 51b, then "DataWrite" are written to the nonvolatile memory 51 without being stored in the write data buffer 49. In this case, "DataWrite" whose data amount is large are not written to or read out from the write data buffer 49. This reduces power consumption.

In addition, "DataWrite" whose data amount exceeds the size of the write data buffer 49 are put into one packet DATWR. This reduces overhead which occurs because of "OpeCode" and the like illustrated in FIG. 5, and therefore reduces a data transfer amount. As a result, communication time and time taken to write to a memory are reduced. Accordingly, power consumption is reduced further.

A reduction in power consumption makes it possible for the semiconductor memory 21 to operate by less power. This increases the communication distance between the reader-writer 20 from which power is supplied and the semiconductor memory 21.

FIG. 10 illustrates an example of the relationship between power received by the semiconductor memory and the distance between the reader-writer and the semiconductor memory. In FIG. 10, a horizontal axis indicates the distance between the reader-writer 20 and the semiconductor memory 21 and a vertical axis indicates power received by the semiconductor memory 21.

Received power P0 at the time when the distance is 0 is equal to power outputted by the reader-writer 20. As the distance increases, received power decreases. For example, if a minimum of received power P1 is used for the operation of the semiconductor memory 21 and the display device 22, then it is impossible to make the communication distance longer than a distance L1. On the other hand, if the semiconductor memory 21 and the display device 22 operate by received power P2, then it is possible to increase the communication distance to a distance L2.

If the address indicated by "ADR" is within the error pre-confirmation area 51a, then the write operation illustrated in FIG. 9 is performed. That is to say, "DataWrite" are temporarily stored in the write data buffer 49. After it is checked that there is no error in "DataWrite," "DataWrite" are written to the nonvolatile memory 51. Accordingly, an address within the error pre-confirmation area 51a is designated for data (such as setting information) whose importance is higher than that of image data or the like. This prevents data in an erroneous state whose importance is high from being written to the nonvolatile memory 51.

In addition, data, such as image data, whose data amount is large are not written to or read out from the volatile buffer 12. As a result, the size of the volatile buffer 12 is suppressed and the cost of the volatile buffer 12 is reduced.

An aspect of the semiconductor memory having a radio communication function and the write control method according to the present disclosure has been described on the basis of the embodiments. However, these are simple examples and the present disclosure is not limited to the above description.

According to an aspect, power consumption is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor memory having a radio communication function, comprising:
   a nonvolatile memory having a first area and a second area;
   a volatile storage circuit;
   a radio communication processor that receives first data including first write data, a first address indicative of a write destination within the first area, and first error detection information for detecting an error in the first write data or second data including second write data whose data amount is larger than a data amount of the first write data and a second address indicative of a write destination within the second area; and
   a controller that determines based on the first address or the second address which of the first data and the second data the radio communication processor has received, that stores, when the radio communication processor has received the first data, the first write data in the storage circuit, detects based on the first error detection information whether or not there is an error in the first write data, and reads out from the storage circuit the first write data in which no error has been detected to store the first write data in the first area based on the first address, and that stores, when the radio communication processor has received the second data, the second write data in the second area based on the second address without storing the second write data in the storage circuit.

2. The semiconductor memory according to claim 1, wherein:
   the second data include second error detection information for detecting an error in the second write data; and
   the controller detects, after storing the second write data in the second area, based on the second error detection information whether or not there is an error in the second write data.

3. The semiconductor memory according to claim 1, wherein:
a first data amount of the first write data is smaller than or equal to a storage capacity of the storage circuit; and
a second data amount of the second write data is larger than the storage capacity of the storage circuit.

4. The semiconductor memory according to claim 1, wherein the second write data are image data.

5. The semiconductor memory according to claim 1, wherein the radio communication processor generates from a radio signal including the first data or the second data an internal voltage for causing the controller to operate.

6. A write control method comprising:
receiving, by a radio communication processor, first data including first write data, a first address indicative of a write destination within a first area of a nonvolatile memory, and first error detection information for detecting an error in the first write data or second data including second write data whose data amount is larger than a data amount of the first write data and a second address indicative of a write destination within a second area of the nonvolatile memory;
determining, by a controller, based on the first address or the second address which of the first data and the second data the radio communication processor has received;
storing, by the controller, when the radio communication processor has received the first data, the first write data in a volatile storage circuit, detecting based on the first error detection information whether or not there is an error in the first write data, and reading out from the storage circuit the first write data in which no error has been detected to store the first write data in the first area based on the first address; and
storing, by the controller, when the radio communication processor has received the second data, the second write data in the second area based on the second address without storing the second write data in the storage circuit.

7. The write control method according to claim 6, wherein:
the second data include second error detection information for detecting an error in the second write data; and
the controller detects, after storing the second write data in the second area, based on the second error detection information whether or not there is an error in the second write data.

8. The write control method according to claim 6, wherein:
a first data amount of the first write data is smaller than or equal to a storage capacity of the storage circuit; and
a second data amount of the second write data is larger than the storage capacity of the storage circuit.

9. The write control method according to claim 6, wherein the second write data are image data.

10. The write control method according to claim 6, wherein the radio communication processor generates from a radio signal including the first data or the second data an internal voltage for causing the controller to operate.

11. A radio communication system comprising:
a semiconductor memory including:
a nonvolatile memory having a first area and a second area;
a volatile storage circuit;
a radio communication processor that receives first data including first write data, a first address indicative of a write destination within the first area, and first error detection information for detecting an error in the first write data or second data including second write data whose data amount is larger than a data amount of the first write data and a second address indicative of a write destination within the second area; and
a controller that determines based on the first address or the second address which of the first data and the second data the radio communication processor has received, that stores, when the radio communication processor has received the first data, the first write data in the storage circuit, detects based on the first error detection information whether or not there is an error in the first write data, and reads out from the storage circuit the first write data in which no error has been detected to store the first write data in the first area based on the first address, and that stores, when the radio communication processor has received the second data, the second write data in the second area based on the second address without storing the second write data in the storage circuit; and
a reader-writer that transmits the first data or the second data to the semiconductor memory.

12. The radio communication system according to claim 11, wherein the reader-writer separates data to be written to the nonvolatile memory into the first write data and the second write data, assigns the first address to the first write data, assigns the second address to the second write data, and generates the first data and the second data.

13. The radio communication system according to claim 11, wherein the reader-writer makes a first data amount of the first write data included in the first data smaller than or equal to a storage capacity of the storage circuit and makes a second data amount of the second write data included in the second data larger than the storage capacity.

14. The radio communication system according to claim 11, further comprising:
a display device connected to the semiconductor memory, wherein the semiconductor memory supplies to the display device setting information for the display device and image data, the setting information being the first write data, the image data being the second write data.

* * * * *